(12) United States Patent
Van Bogget

(10) Patent No.: US 7,148,727 B2
(45) Date of Patent: Dec. 12, 2006

(54) READ-OUT CIRCUIT FOR INFRARED DETECTORS

(75) Inventor: Urbain Van Bogget, Tongeren (BE)

(73) Assignee: Xenics N.V., Leuven (BE)

( * ) Notice: Subject to any disclaimer, the term of this patent is extended or adjusted under 35 U.S.C. 154(b) by 0 days.

(21) Appl. No.: 11/120,504

(22) Filed: May 3, 2005

(65) Prior Publication Data

US 2005/0199813 A1  Sep. 15, 2005

Related U.S. Application Data

(63) Continuation of application No. PCT/BE03/00187, filed on Nov. 6, 2003.

(60) Provisional application No. 60/425,036, filed on Nov. 7, 2002.

(51) Int. Cl.
*H03K 5/22* (2006.01)

(52) U.S. Cl. .................. 327/77; 327/337; 327/87

(58) Field of Classification Search ............ 327/77–79, 327/87, 337
See application file for complete search history.

(56) References Cited

U.S. PATENT DOCUMENTS

| | | | | |
|---|---|---|---|---|
| 4,047,059 A | * | 9/1977 | Rosenthal | 327/66 |
| 4,978,872 A | | 12/1990 | Morse et al. | 327/427 |
| 5,023,688 A | * | 6/1991 | Ando et al. | 327/379 |
| 5,905,398 A | * | 5/1999 | Todsen et al. | 327/337 |
| 6,087,897 A | * | 7/2000 | Wang | 330/9 |
| 2004/0149910 A1 | * | 8/2004 | Hatatani et al. | 250/338.3 |

FOREIGN PATENT DOCUMENTS

EP  0 389 969 A2  10/1990

OTHER PUBLICATIONS

Caiulo et al., "Design of High-Accuracy Video Comparator," 1994 IEEE International Symposium on Circuits and Systems, London, UK.

* cited by examiner

*Primary Examiner*—Long Nguyen
(74) *Attorney, Agent, or Firm*—Knobbe Martens Olson & Bear LLP

(57) ABSTRACT

The present invention is related to a device comprising a capacitive feedback transimpedance operational amplifier, that comprises a main operational amplifier (with a first input, a second input and an output) and an integrating capacitor, connected between the second input and the output, and a first switch connected in parallel to the integrating capacitor. The device further comprises an auto-zero operational amplifier having a third input and a fourth input, whereby to the third input and the first input signals at virtual ground potential are applied. The fourth input is connected to the output by a circuit comprising two offset error capacitors, a second switch and a third switch.

14 Claims, 7 Drawing Sheets

READ-OUT CIRCUIT FOR INFRARED DETECTORS

RELATED APPLICATIONS

This is a continuation application under 35 U.S.C. § 120 of International Patent Application No. PCT/BE2003/00187, filed on Nov. 6, 2003 under Patent Cooperation Treaty (PCT), which was published by the International Bureau in English on May 21, 2004 as WO 04/043062, which designates the U.S. and claims the benefit under 35 U.S.C. § 119(e) of U.S. Provisional Patent Application No. 60/425, 036, filed Nov. 7, 2002. The PCT Application No. PCT/BE03/00187 and U.S. Provisional Application No. 60/425, 035 are hereby incorporated by reference.

BACKGROUND OF THE INVENTION

1. Field of the Invention

The present invention is related to low offset, low noise auto-zeroed CMOS integrated circuit amplifiers and more in particular to read-out circuits for infrared detectors.

2. Description of the Related Art

A focal plane array comprises several individual detector elements (pixels). The number of pixels in a linear or focal plane array is increasing. The signal multiplexer is a high complexity detector specific integrated circuit, which reads all channels in parallel. The most commonly used detector circuits are the direct injection stage and the capacitive feedback transimpedance amplifier (CTIA).

A conventional detector buffer stage in a read-out circuit comprises a capacitive feedback transimpedance amplifier. The goal of the CTIA is to accumulate all detector current, preferably under the condition of zero bias or some reverse bias where the dynamic resistance is high. The amplifier keeps the detector at virtual ground while the detector current is flowing onto the capacitor, generating a voltage signal at the output proportional to the integration time and the signal current. The DC coupling between the detector and the CTIA yields an excellent linearity of the detector current to output voltage conversion. In the ideal condition of zero offset there is no influence of dark current and hence of dark current noise. In this case the detector shunt resistance does not play a role as there is no voltage difference over the detector. In practice however such a circuit has a major drawback, namely the op-amp input voltage non-uniformity (offset), causing fixed pattern noise on the read-out circuit and limiting the integration time. The circuit needs to be suited for measuring extremely small currents generated by infrared diodes with relatively low parallel resistance and needs therefore amplifiers with very small offset error voltages.

In order to correct said op-amp input voltage non-uniformity it is common to use an auto-zero (AZ) circuit. Such a scheme is for example discussed in "Circuit Techniques for Reducing the Effects of Op-Amp Imperfections: Autozeroing, Correlated Double Sampling and Chopper Stabilisation", C. Enz and G. Themes, Proceedings of the IEEE, vol. 84, No. 11, November 1996, pp. 1584–1614) and in U.S. Pat. No. 4,884,039. This patent discloses a differential amplifier including a linear offset operation circuit comprising sources providing a reference voltage and an offset correction voltage and a pair of auxiliary transistors for supplying currents for correcting offset errors of the amplifier.

Some numerical results on residual offset voltages can be found in 'A micropower CMOS instrumentation amplifier', IEEE J.Solid-State Circ., vol.SC-20, pp.805–807, June 1985.

SUMMARY OF CERTAIN INVENTIVE ASPECTS

Embodiments of the present invention aim to provide a low noise, high uniformity auto-zeroed integrated circuit amplifier overcoming the problems of the prior art solutions. More specifically it provides a read-out circuit for infrared detectors.

In one embodiment of the present invention, there is a read-out circuit for infrared detection comprising a device comprising a capacitive feedback transimpedance operational amplifier, comprising a main operational amplifier, having a first input, a second input and an output, and an integrating capacitor connected between said second input and said output, a first switch connected in parallel to said integrating capacitor, said device further comprising an auto-zero operational amplifier having a third input and a fourth input, whereby to said third input and said first input, signals at virtual ground potential are applied, whereby said fourth input is connected to said output by a circuit comprising two offset error capacitors, a second switch and a third switch.

Said offset error capacitors may have a terminal connected to said virtual ground potential. Said auto-zero operational amplifier may comprise resistor connected Metal-Oxide Semiconductor transistors. Said second switch and said third switch each may comprise four transistors. Said integrating capacitor may comprise a plurality of capacitors in parallel, whereby in each parallel branch an isolating switch is provided on either side of the capacitor in said branch. Said output may be further connected to a sample & hold circuit. The read-out circuit for infrared detection may additionally comprise a plurality of said devices.

DETAILED DESCRIPTION OF CERTAIN EMBODIMENTS

The following detailed description of certain embodiments presents various descriptions of specific embodiments of the present invention. However, the present invention can be embodied in a multitude of different ways as defined and covered by the claims. In this description, reference is made to the drawings wherein like parts are designated with like numerals throughout.

Figure 1:
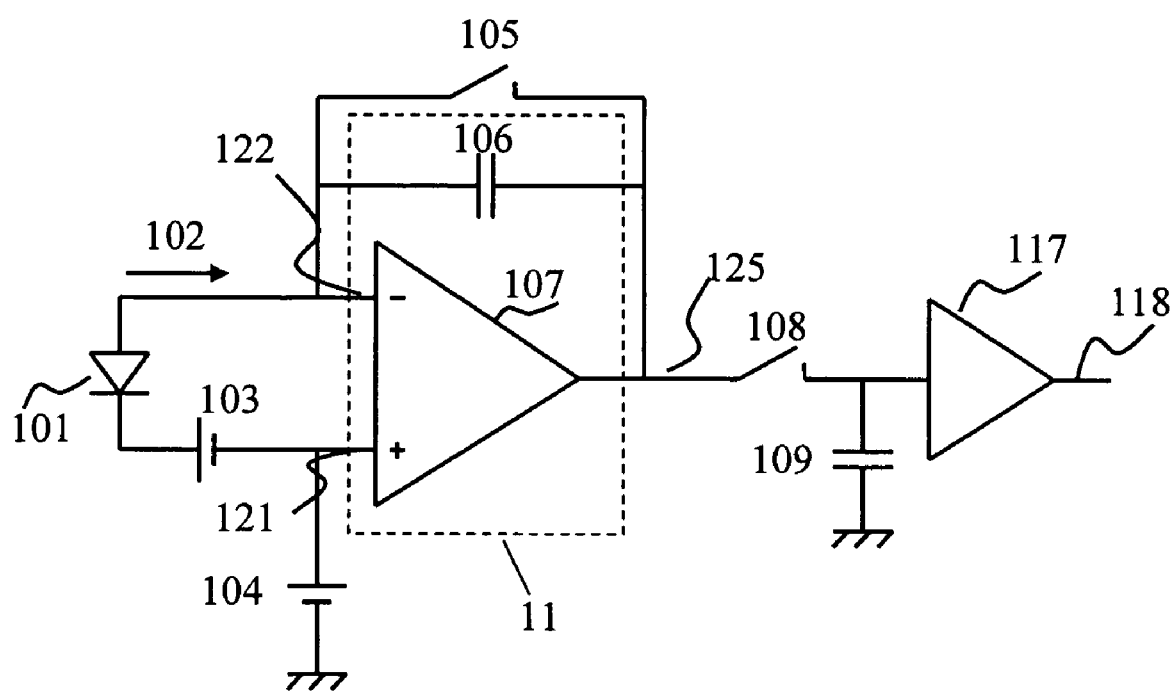
FIG. 1 represents a prior art detector buffer stage without Auto Zero correction.

FIG. 1 shows a prior art detector buffer stage, consisting of a charge sensitive transimpedance amplifier (CTIA) (11). The CTIA accumulates all detector current 102, preferably under zero bias or some reverse bias 103 where the dynamic resistance is high. However one always has to deal with a varying offset voltage. Therefore when applying CMOS amplifiers it is common to use an auto-zero (AZ) circuit. The system exhibits an excellent linearity of the detector current 102 to output voltage conversion due to the DC coupling between the infrared detector diode 101 and the low equivalent input impedance presented at the differential inputs −(122) and +(121) of the main amplifier 107 and its integrating capacitor 106 combination forming the CTIA (11). The non-uniformity of the input offset voltage of the individual op-amps in a focal plane array, however, gives rise to so called fixed pattern noise on an array of such read-outs and limits the integration time because of the early saturation of the worse channels.

Figure 2:
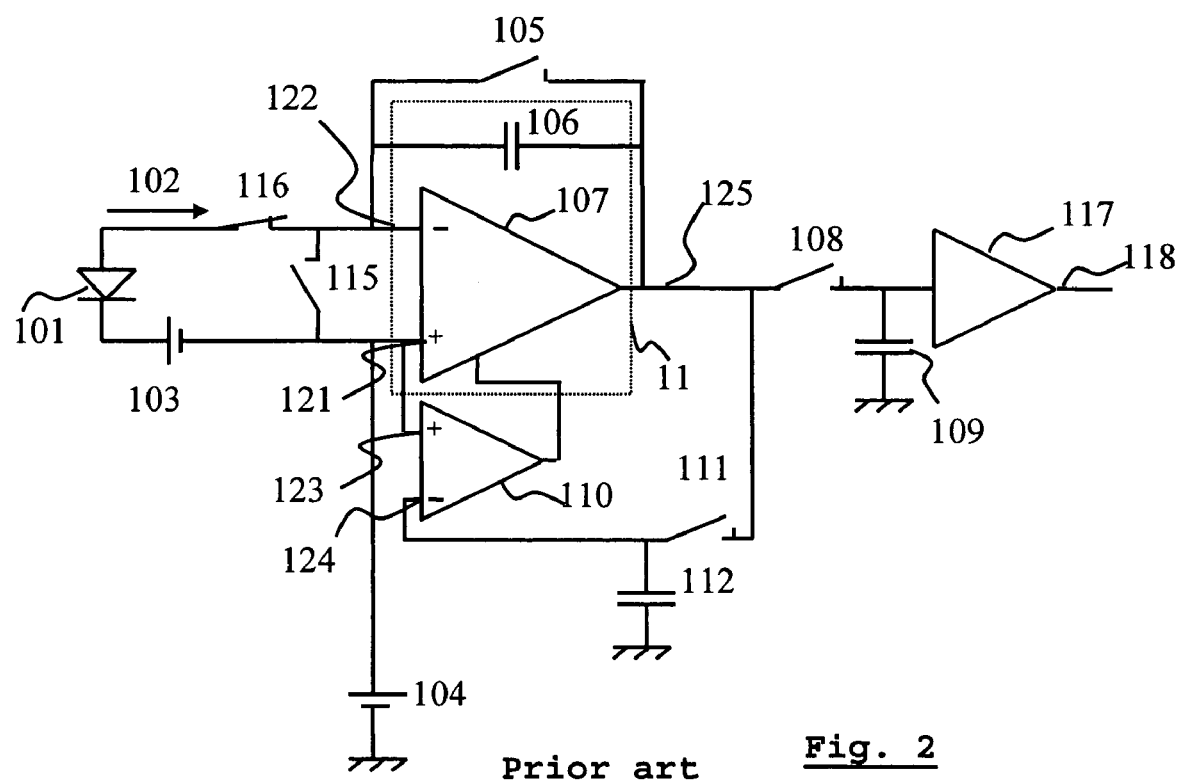
FIG. 2 represents a prior art detector buffer stage with Auto Zero correction.

FIG. 2 shows a modified version of the above schematic based on an auxiliary Auto-Zero (AZ) op-amp, which corrects for the above described anomaly. The scheme shows a dual op-amp design, where the AZ op-amp 110 is used to reduce the offset effects of the main CTIA stage 11. This correcting AZ opamp 110 is known to provide a certain transconductance attenuation as compared to the main op-amp 107 by the introduction of source degeneration resistors 408 and 409 (see also FIG. 4). Before the start of each integration cycle, each CTIA is auto-zeroed again by closing simultaneously the AZ switch 111 and switch 115 and opening the optional switch 116. At the end of this cycle, the correction coefficient is stored on the capacitor 112 of the auxiliary amplifier 110 by first opening the switch 111. Then the CTIA main op-amp 107 and its integration capacitor 106 are reset to the virtual zero start point by closing switch 105 during a short time. Then the real integration cycle starts and it ends with the sampling (by closing switch 108) and holding (by opening switch 108) the amplifiers output voltage resulting from the integrated detector current signal on the S&H capacitor 109. Finally all acquired information stored on the hold capacitors 109 of an array of identical circuits is read out by applying a start pulse to the selection shift register. This register sequentially selects each channel's output 118 buffered by a follower amplifier 117 and directs its output signal to a common output buffer amplifier generating a so called video signal. This signal can be visualized on a video display screen to give an image of the signals detected by the infrared diode array.

Figure 4:
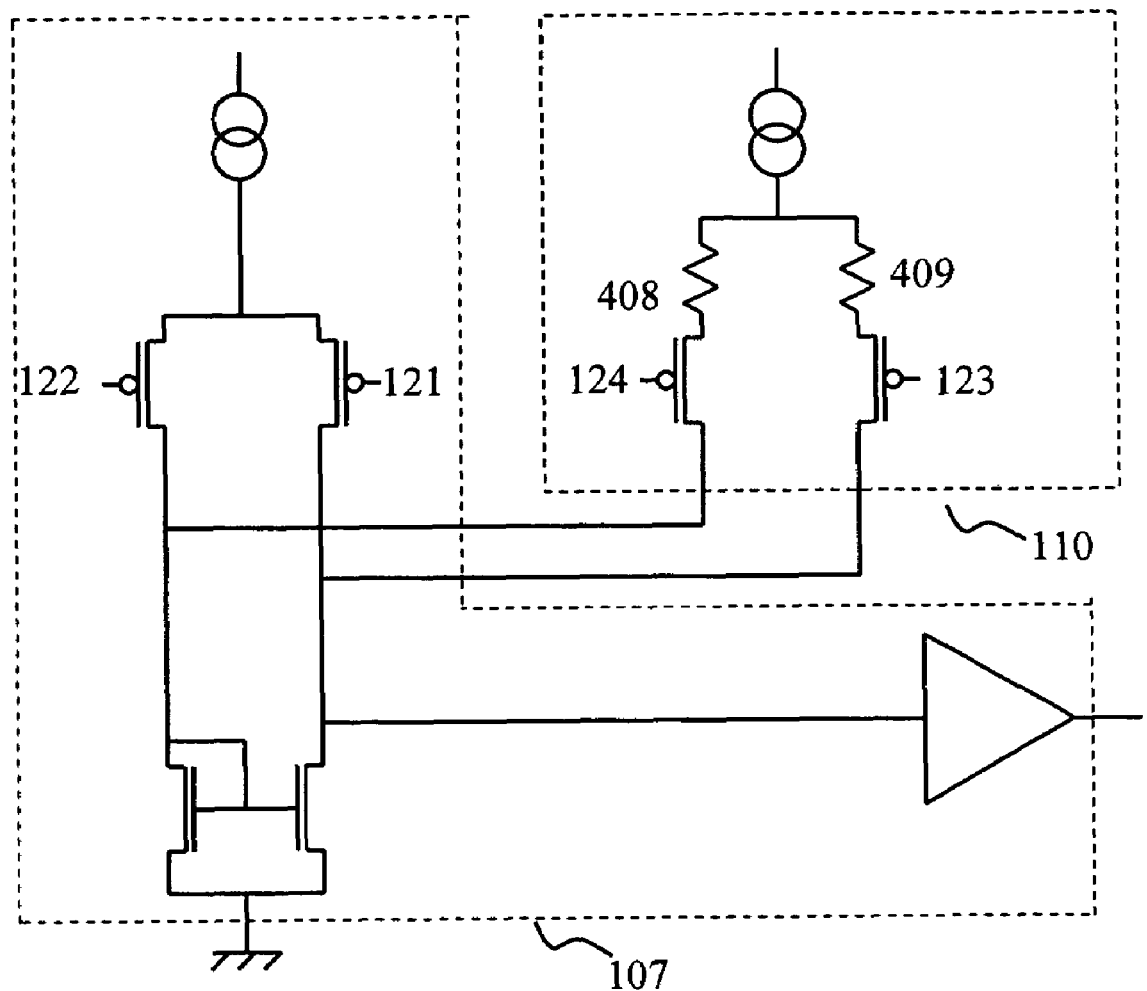
FIG. 4 represents the transistor level details of the principal CTIA op-amp and the AZ amplifier.
Figure 5:
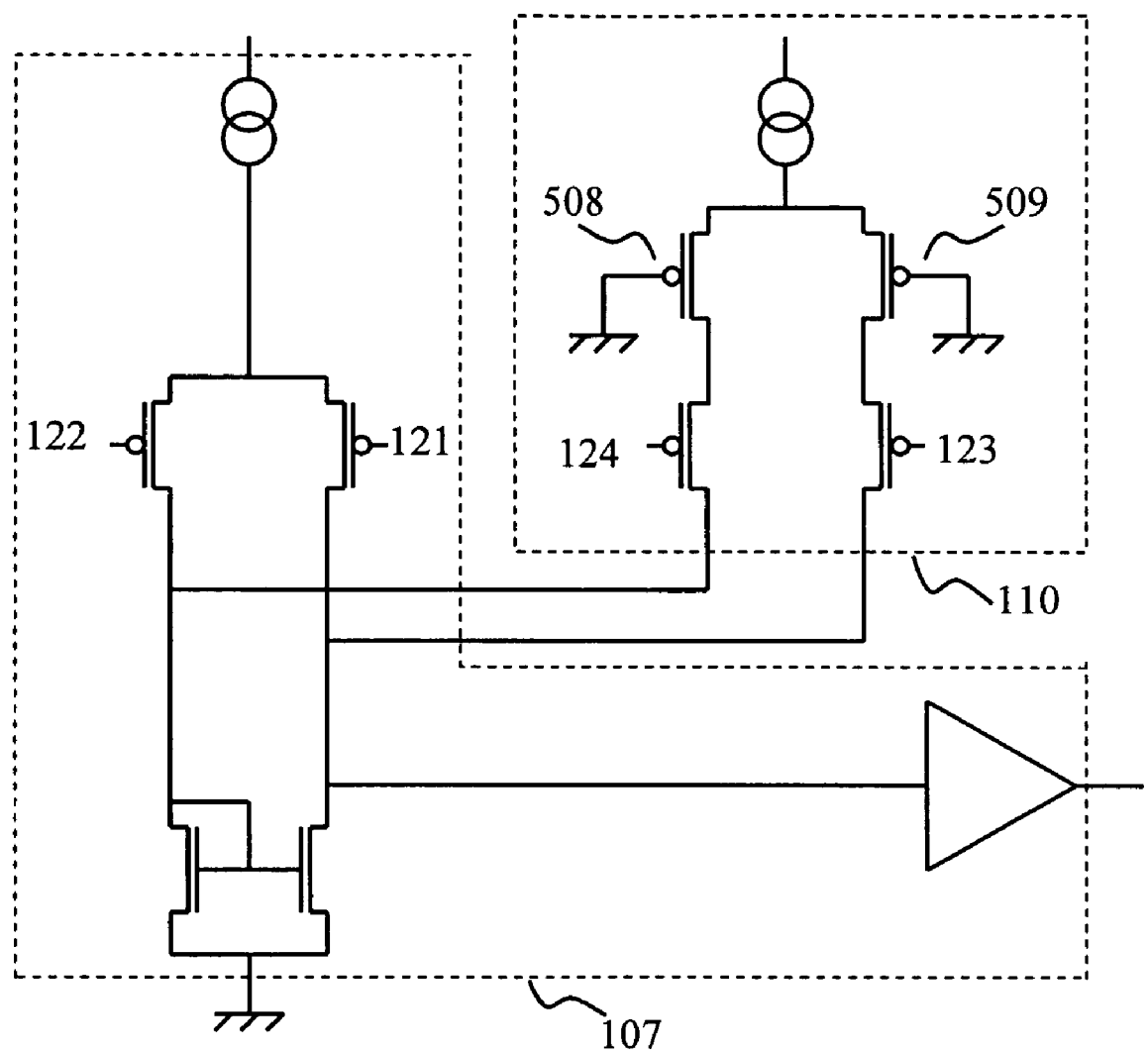
FIG. 5 represents an alternative solution of the transistor level details of the principal CTIA op-amp and the AZ amplifier.

The auto-zero scheme of FIG. 2 is known within the electronics community. The scheme of FIG. 3 however comprises a combination of novel features that cannot be found in prior art solutions. The amplifier's common mode rejection is used to attenuate noise. The AZ amplifier is preferably not constructed as an independent circuit block, but is embedded in the first stage of the principal CTIA op-amp (as shown in FIGS. 4 and 5). It is designed in such a way that it corrects the current flowing in the principal op-amp 107 to approach better the virtual ground potential 104. U.S. Pat. No. 4,884,039 also uses an embedded solution, but there the external capacitor is not differentially coupled. A differential amplifier is more sensitive to a differential voltage at its inputs than a so called common-mode voltage (i.e. a same voltage applied at the inputs). Therefore, the error correction voltage stored in the Auto-Zero correction capacitor is directly connected across the differential inputs for which the amplifier is most sensitive. One of the terminals of the correction capacitor is connected to the virtual ground, which can be noisy or slowly varying. This is particularly the case since usually an externally provided voltage will be applied, as a common mode voltage to the amplifier's inputs, by virtue of the capacitor's principle to keep the voltage at its terminals constant.

Figure 3:
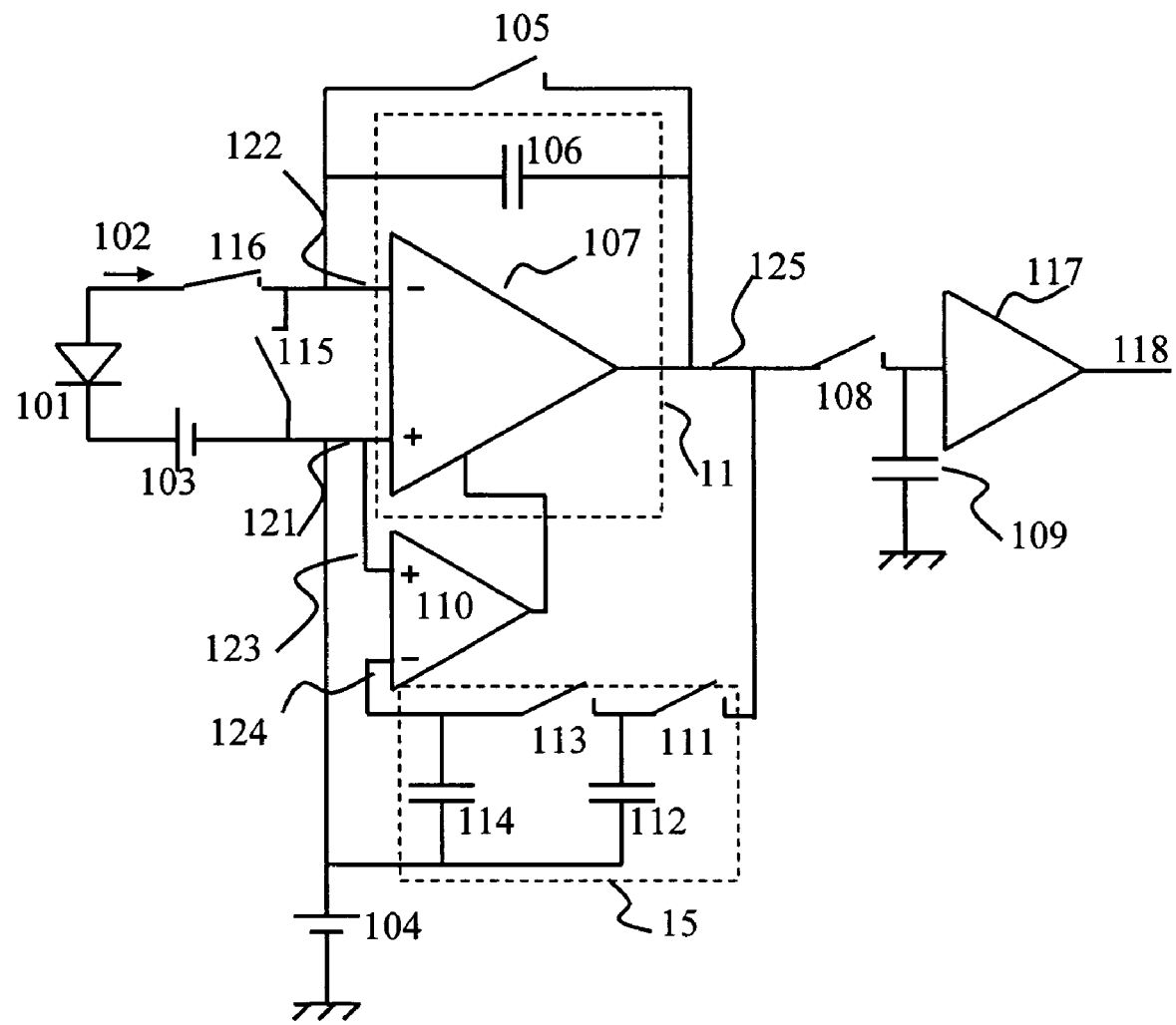
FIG. 3 represents the novel Auto Zero correcting scheme of the invention.

FIG. 3 shows a novel means to achieve long integration time and yet keep very good linearity while keeping relatively small footprint requirements. A conventional AutoZero is performed with only one switch 111 and one error storage capacitor 112 (see also FIG. 2). This has two important drawbacks. The amplifiers output dV/dt together with the MOS switch drain source stray capacitances and subtreshold or weak inversion current cause a small, but yet non-negligible current to flow into the storage capacitor 112. This causes the stored error voltage to vary slightly, which gives rise to an output non-linearity, particularly at long integration times, or with small integration capacitor value or both, thus when the system is most sensitive to input current and hence to offset errors. By providing a second capacitor 114 and switch 113 a much better insulation from the amplifiers output dV/dt is ensured, because of the very low voltage difference across the second switch 113.

Figure 6:
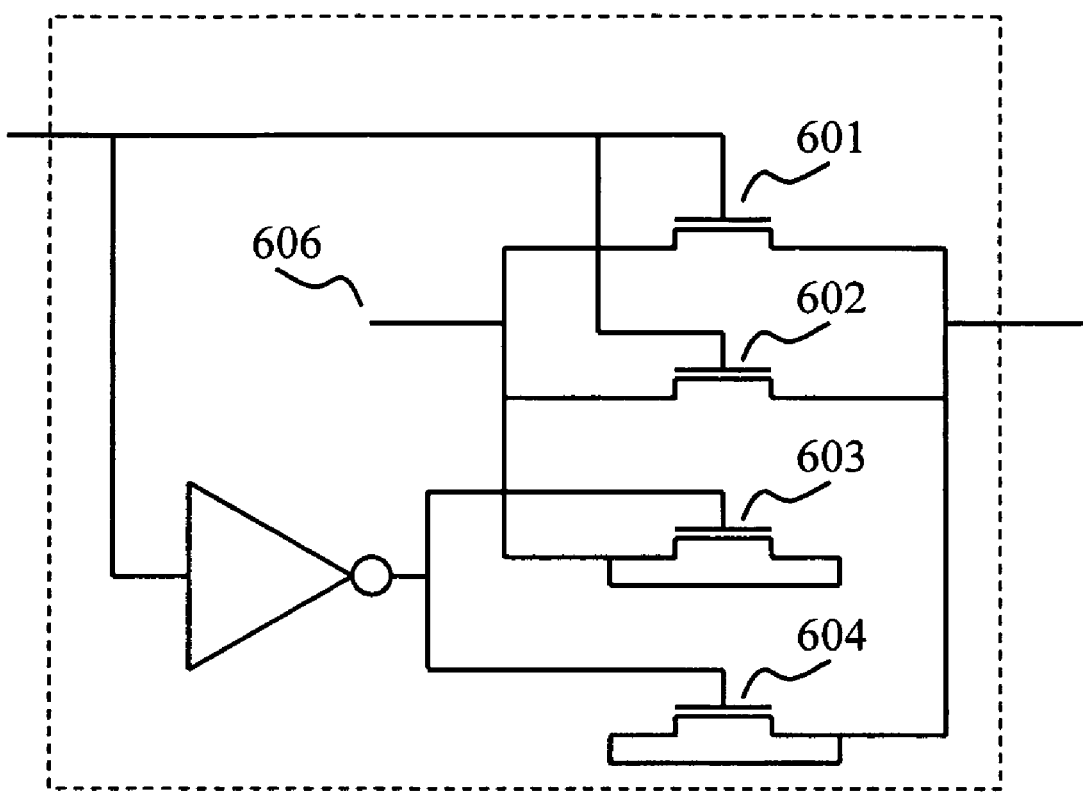
FIG. 6 represents the transistor level details of the four transistors auto-zero switch solution.

The double capacitor (114, 112), double switch (113, 111) solution used greatly reduces remaining voltage errors on the correction capacitors, particularly with the additional usage of 4 special, fully compensated MOS switches 601, 602,603,604 (FIG. 6), yielding a nearly perfect matching. The switches are designed to minimize the charge injection on both sides of the switches, thereby also minimizing the systematic offset error. In a solution with 3 transistors, as e.g. proposed in Enz, compensation is impossible to achieve, as transistors of different size are required, and so process variations will cause unpredictable ratios between the effective transistor sizes. To minimize offset correction voltage errors and noise, the capacitors are directly connected across the differential inputs of the correcting amplifier 110 as already discussed before. In this way, possible noise or slow changes of the virtual ground voltage source 104 is attenuated by the common mode rejection of the differential input stage 110. In this way residual offset voltages as low as 10 µV at a 5V supply voltage can be obtained, whereas an offset voltage of 200 µV at a 3V supply voltage is reported in the prior art.

FIG. 4 shows more in detail the combined main and AZ op-amp including the so called source degeneration resistors 408 and 409. FIG. 4 shows a solution with PMOS differential input transistors, but to a person skilled in the art it is clear that this is just an example of a possible implementation and that a scheme with all transistors types and supply polarities inverted has exactly the same basic function. The correction differential input pair's source degeneration resistors 408–409 in FIG. 4 can be alternatively replaced by resistor connected MOS transistors 508–509 as shown in a detailed alternative schematic in FIG. 5. It shows an important detail of the AZ correcting differential input pair, namely the usage of so called source degeneration resistors or resistor connected MOS transistors in the sources of the offset compensating MOS transistor pair. The MOS transistors modify the transfer characteristics in such a way that a much lower transconductance is obtained. Furthermore said transconductance is nearly linear over a much wider voltage range than a conventional MOS input pair. In this way, all imperfections of the offset compensation voltage are also reduced in the same ratio as the transconductances ratio between primary and secondary correction input pair. Also large offset voltage errors can still be captured and corrected, resulting in an overall better end product yield and guaranteed long term operation. The use of said resistor connected MOS transistors additionally offers the considerable advantage of being applicable in all CMOS processes.

Figure 7:
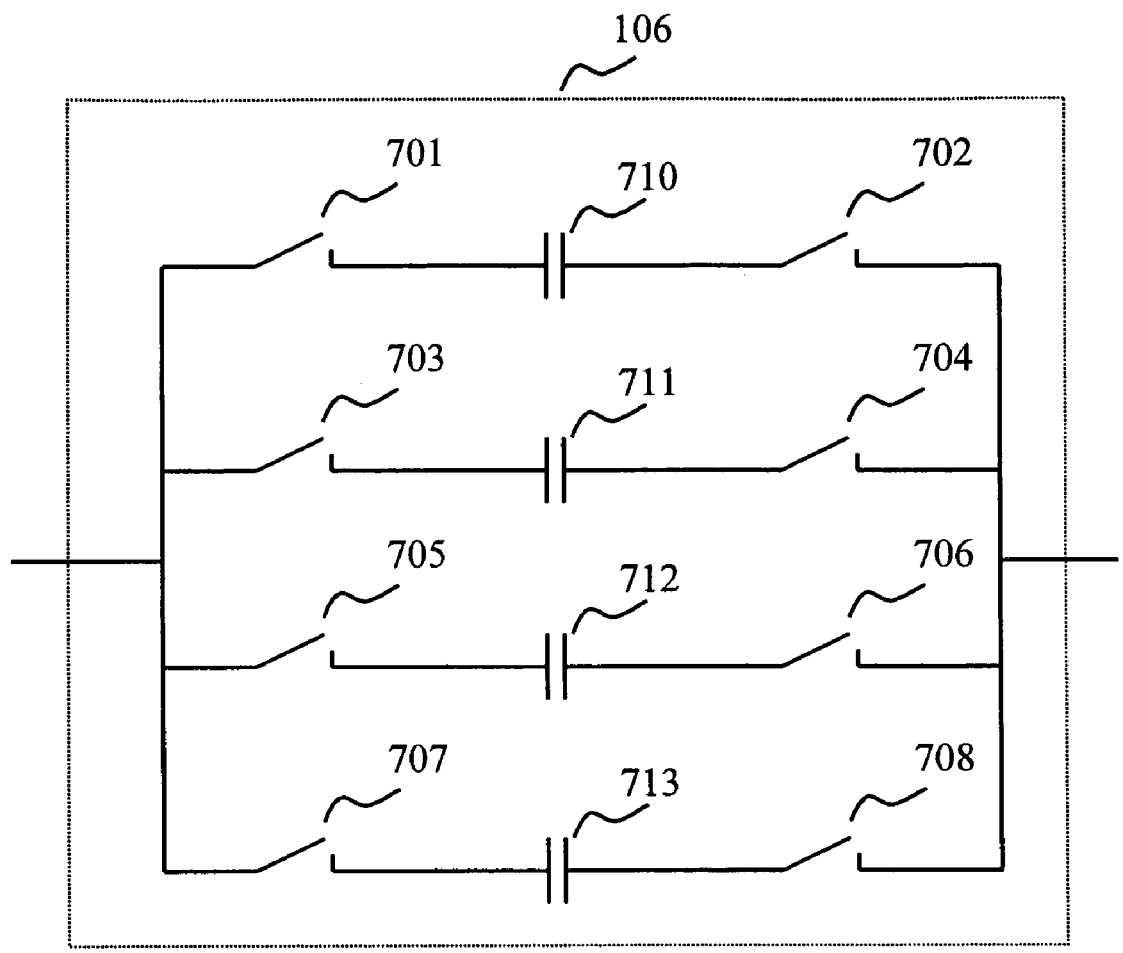
FIG. 7 represents the details of a double side switched integration capacitor for a multiple auto-zero scheme.

Certain embodiments of the invention relate to the CTIA feedback or integration capacitors. As shown in FIG. 7, which is a detail of a possible implementation of the integration capacitor 106 in FIG. 3, the different capacitors 710 to 713 are of different values to allow to change the value of the total capacitor connected across the amplifiers feedback in order to modify the sensitivity of the resulting integrator. It is obvious that the number of capacitors and their value will vary from design to design depending on the range and values of transimpedance value (or gain) required. The capacitors are not single sided switched, but double sided (see switches 701 to 708). This measure allows to fully isolate the capacitor from its environment and to execute other charge domain operations without affecting the information charge on the (switched off) feedback capacitors. This last feature is necessary to introduce the multiple AZ concept. With this signal acquisition method, on regular times within the overall integration time frame the feedback capacitors are switched off from the CTIA amplifier. At that moment a new AZ operation is executed and then the feedback capacitor is again connected to the CTIA to continue the integration cycle. The effect of this multiple AZ scheme is that in effect it will average the noise voltage of the successive AZ's. This is because despite all means used to minimize noise, there will always remain a small amount of it in the stored auto-zero correction voltage so that successive readings of the same small infrared diode current will result in possibly relatively large errors in the successive integrated output voltage values.

While the above detailed description has shown, described, and pointed out the fundamental novel features of the invention as applied to various embodiments, it will be understood that various omissions and substitutions and changes in the form and details of the system illustrated may be made by those skilled in the art, without departing from the intent of the invention.

I claim:

1. A read-out circuit for infrared detection comprising:
    a device comprising
        a capacitive feedback transimpedance operational amplifier, comprising a main operational amplifier, having a first input, a second input and an output, and an integrating capacitor connected between said second input and said output,
        a first switch connected in parallel to said integrating capacitor, said device further comprising
        an auto-zero operational amplifier having a third input and a fourth input,
    whereby to said third input and said first input, signals at virtual ground potential are applied, whereby said fourth input is connected to said output by a circuit comprising two offset error capacitors, a second switch and a third switch wherein said second and third switches are connected in series between said fourth input and said output, and wherein said two offset error capacitors are directly connected to said first input.

2. The read-out circuit for infrared detection as in claim 1, wherein said offset error capacitors have a terminal connected to said virtual ground potential.

3. The read-out circuit for infrared detection as in claim 1, wherein said auto-zero operational amplifier comprises resistors formed from Metal-Oxide Semiconductor transistors.

4. The read-out circuit for infrared detection as in claim 1, wherein said second switch and said third switch each comprise four transistors.

5. The read-out circuit for infrared detection as in claim 1, wherein said integrating capacitor comprises a plurality of capacitors connected in parallel, whereby in each parallel branch an isolating switch is provided on either side of the capacitor in said branch.

6. The read-out circuit for infrared detection as in claim 1, wherein said output is further connected to a sample-and-hold circuit.

7. The read-out circuit for infrared detection further comprising a plurality of devices, wherein each of the plurality of devices is the device as in claim 1.

8. A read-out circuit for infrared detection comprising:
    a device comprising
        a capacitive feedback transimpedance operational amplifier, comprising a main operational amplifier, having a first input, a second input and an output, and an integrating capacitor connected between said second input and said output,
        a first switch connected in parallel to said integrating capacitor, said device further comprising
        an auto-zero operational amplifier having a third input and a fourth input,
    whereby to said third input and said first input, signals at virtual ground potential are applied, whereby said fourth input is connected to said output by a circuit comprising two offset error capacitors, a second switch and a third switch, wherein the second switch is directly connected to said output, and wherein a first of said offset error capacitors is located between the second switch and said virtual ground potential and a second of said offset error capacitors is located between the third switch and said virtual ground potential.

9. The read-out circuit for infrared detection as in claim 8, wherein said offset error capacitors have a terminal connected to said virtual ground potential.

10. The read-out circuit for infrared detection as in claim 8, wherein said auto-zero operational amplifier comprises resistors formed from Metal-Oxide Semiconductor transistors.

11. The read-out circuit for infrared detection as in claim 8, wherein said second switch and said third switch each comprise four transistors.

12. The read-out circuit for infrared detection as in claim 8, wherein said integrating capacitor comprises a plurality of capacitors connected in parallel, whereby in each parallel branch an isolating switch is provided on either side of the capacitor in said branch.

13. The read-out circuit for infrared detection as in claim 8, wherein said output is further connected to a sample-and-hold circuit.

14. The read-out circuit for infrared detection further comprising a plurality of devices, wherein each of the plurality of devices is the device as in claim 8.

* * * * *

UNITED STATES PATENT AND TRADEMARK OFFICE
CERTIFICATE OF CORRECTION

PATENT NO. : 7,148,727 B2 Page 1 of 1
APPLICATION NO. : 11/120504
DATED : December 12, 2006
INVENTOR(S) : Urbain Van Bogget It is certified that error appears in the above-identified patent and that said Letters Patent is hereby corrected as shown below:

| Column | Line | Description of Errors |
|---|---|---|
| 1 | 8 (Approx.) | After "under" insert --the--. |
| 5 | 55 | In Claim 1, after "switch" insert --,--. |

Signed and Sealed this

Twenty-fourth Day of November, 2009

David J. Kappos
*Director of the United States Patent and Trademark Office*